United States Patent
Behun et al.

(10) Patent No.: US 6,654,488 B1
(45) Date of Patent: Nov. 25, 2003

(54) FILL PATTERN INSPECTION

(75) Inventors: J. Richard Behun, Williston, VT (US); Jacek G. Smolinski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/346,468

(22) Filed: Jul. 1, 1999

(51) Int. Cl.⁷ ............................................ G06K 9/00
(52) U.S. Cl. ................ 382/144; 382/145; 382/149; 430/5; 430/30
(58) Field of Search ................. 382/141, 149, 382/144, 145, 146, 147, 151, 155, 209; 430/5, 30

(56) References Cited

U.S. PATENT DOCUMENTS

| | | | |
|---|---|---|---|
| 4,148,065 A | | 4/1979 | Nakagawa et al. |
| 4,555,798 A | | 11/1985 | Broadbent, Jr. et al. |
| 4,636,088 A | * | 1/1987 | Rosencwaig et al. ......... 374/5 |
| 4,896,278 A | | 1/1990 | Grove |
| 4,969,198 A | | 11/1990 | Batchelder et al. |
| 5,012,523 A | * | 4/1991 | Kobayashi et al. ......... 382/145 |
| 5,442,714 A | | 8/1995 | Iguchi |
| 5,479,252 A | | 12/1995 | Worster et al. |
| 5,640,200 A | | 6/1997 | Michael |
| 5,798,947 A | * | 8/1998 | Ye et al. ....................... 702/95 |
| 5,849,440 A | | 12/1998 | Lucas et al. |
| 5,917,332 A | * | 6/1999 | Chen et al. ................. 324/765 |
| 5,949,547 A | * | 9/1999 | Tseng et al. ................ 356/614 |

* cited by examiner

Primary Examiner—Bhavesh M. Mehta
Assistant Examiner—Ali Bayat
(74) Attorney, Agent, or Firm—Scully, Scott, Murphy & Presser; William D. Sabo, Esq.

(57) ABSTRACT

Fill pattern inspection system and method where the fill patterns are inspected to a different criteria than the primary pattern or not inspected at all. The fill pattern images are marked such that they may be identified by easily recognizable shapes or designations to avoid unnecessary inspections and repairs in the fill areas. Alternatively, subresolution markers are placed in an image data for locating fill pattern areas. A software tool is also programmed to automatically detect the subresolution markers during inspection and to inspect the regions on a plate which correspond to the subresolution markers in the image data at a different level of criteria than one which is employed for primary pattern inspection.

9 Claims, 3 Drawing Sheets

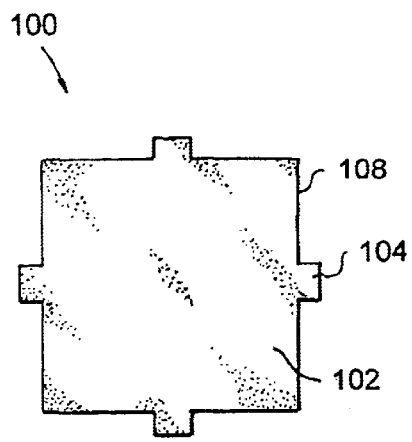
Fig. 1
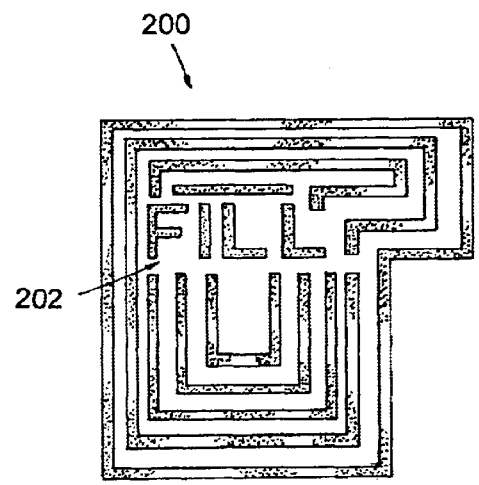
Fig. 2
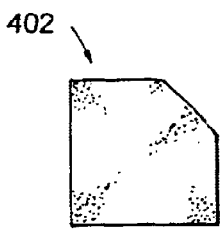 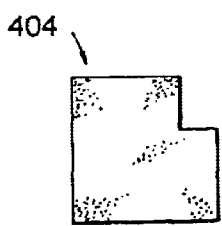 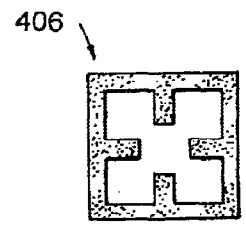
Fig. 4a   Fig. 4b   Fig. 4c

FILL PATTERN INSPECTION

DESCRIPTION

1. Technical Field

The present invention relates generally to semiconductors and more particularly to a method of inspecting fill patterns on semiconductor masks.

2. Prior Art

A semiconductor is a material having a value of resistivity midway between that of conductors and insulators. Although a raw semiconductor material cannot transfer electricity or light, when heat, light, or impurities are added, electricity can be transferred. Moreover, the amount of the transfer can be controlled. Semiconductor manufacturing is generally divided into three phases: fabrication, assembly, and testing. During the fabrication stage, a wafer of raw semiconductor material is typically treated through a process referred to as photolithography in preparation for the fabrication of integrated circuits.

Photolithography process generally involves exposing light through a photomask onto a photoresist coating on a wafer. Photomask typically includes a transparent portion and an opaque portion, thereby forming a pattern and selectively exposing the light to the photoresist coating according to the pattern. Photoresist coatings are produced from organic solutions which, when exposed to light of the proper wavelength, are chemically changed in their solubility to certain solvents (developer). For example negative-acting resist is initially a mixture which is soluble in its developer but after light exposure becomes polymerized and insoluble to the developer. Thus, when the light is exposed through a photomask having a pattern formed by its transparent and opaque portions onto the photoresist, the unexposed resist selectively dissolves, softens, or washes away, leaving the desired pattern on the underlying wafer. Positive-acting resists work in the opposite fashion, i.e., exposure to light makes the polymer mixture soluble in the developer. Thus, in positive-acting resists, the transparent portions of the mask correspond to the desired pattern or image to be provided in the resist coating. The remaining pattern then is treated through the rest of the fabrication process for forming a desired semiconductor device.

The patterns formed on the semiconductor provides the yield and reliability of the semiconductor devices. Therefore, it is highly desirable that such patterns have a high degree of accuracy. Moreover, because the quality of the pattern formation is determined largely by the quality of the photomask, it is also highly desirable that the photomasks have an accurate and precise patterns.

Presently, as the complexity and amount of circuitry within each individual integrated circuit increases, there is an increase in the number of layers used in a single chip, affecting the planarity and uniformity of topology underlying some layers. The planarity or the uniformity of topology underlying a deposited layer of material can have a significant impact on the ability to pattern and etch the deposited layer. Therefore, for masks used on some lithography levels or layers a fill is added, typically by a mask manufacturer, to assure constant loading of a pattern. A fill generally refers to a series of contact holes.

The masks are then tested to ensure that the desired accuracy and preciseness is achieved in semiconductor manufacturing by employing various inspection tools utilized to inspect and detect defects in pattern formations. Most of the known inspection tools generally compare images to design and/or images to images to detect malformations in the patterns. The fill images physically present on a mask generally have no critical function in the printed image and need not undergo an equally intense inspection phase. During the testing phase, however, these additional fill pattern images create additional challenges, unnecessary work, and detractions. For instance, the fill patterns are inspected as a main pattern even if it is not necessary to achieve proper loading. Since operators cannot distinguish between real pattern and fill defects, the masks are inspected using the same criteria as a functional pattern, thereby creating significant additional defect counts and workload. Because there is an uncertainty whether or not a pattern is important, all defects are repaired during the inspection process, creating unnecessary handling, inspections and repairs which in some instances may lead to plate scraping and damages. Therefore, it is highly desirable to be able to identify the fill patterns which need not pass an inspection process, and to be able to omit unnecessary inspections and repairs of these fill patterns.

SUMMARY OF THE INVENTION

The present invention is a system implemented for marking the fill images so that an operator or an automatic software system can easily recognize and avoid unnecessary inspection and repairs in the fill area. The fill images are made in an unusual shape typically not occurring on a plate. Such shapes may include serifs in the middle of the side of the contact, rather than the usual corner serifs. The shapes may also have alphanumeric forms.

In another embodiment, subresolution markers having values, for example, of 0.01 micrometers (um) may be placed to designate fill images and or regions on a design plate image data that are used by inspection tools for inspecting plates. The inspection software or tool in conjunction with the markers may be programmed to sort the data and create "do not inspect" or reduced sensitivity regions for the areas where the markers are placed. The inspection software or tool would then run at full sensitivity only on the real patterns, skipping the inspection or inspecting at a reduced sensitivity of the marked areas which represent the fill images.

Identifying large areas in which fill shapes are placed and programming an inspection tool to either to skip these areas or to inspect with a larger granularity of sensitivity, for example, to inspect defects only of 0.5 micron dimensions or greater would result in a highly efficient mask testing process.

Advantageously, the fill areas are typically defined by a circuit designer on a separate layer of data so that the locations of fill areas are easily identified and quantified. When the locations of the fill areas are identified from the separate layer having fill patterns, the subresolution markers may then be placed in the areas in the pattern image corresponding to the identified areas.

Further features and advantages of the present invention as well as the structure and operation of various embodiments of the present invention are described in detail below with reference to the accompanying drawings. In the drawings, like reference numbers indicate identical or functionally similar elements.

BRIEF DESCRIPTION OF THE DRAWINGS

Preferred embodiments of the present invention will now be described, by way of example only, with reference to the accompanying drawings in which:

FIG. 1 illustrates an example of a mask of the present invention having a contact hole fill of an unusual shape;

FIG. 2 illustrates an example of a mask of the present invention having an alphanumeric fill pattern;

FIG. 4 illustrates examples of atypical fill pattern shapes of the present invention for designation fill patterns on a plate.

DETAILED DESCRIPTION OF THE PREFERRED EMBODIMENT OF THE INVENTION

Figure 3:
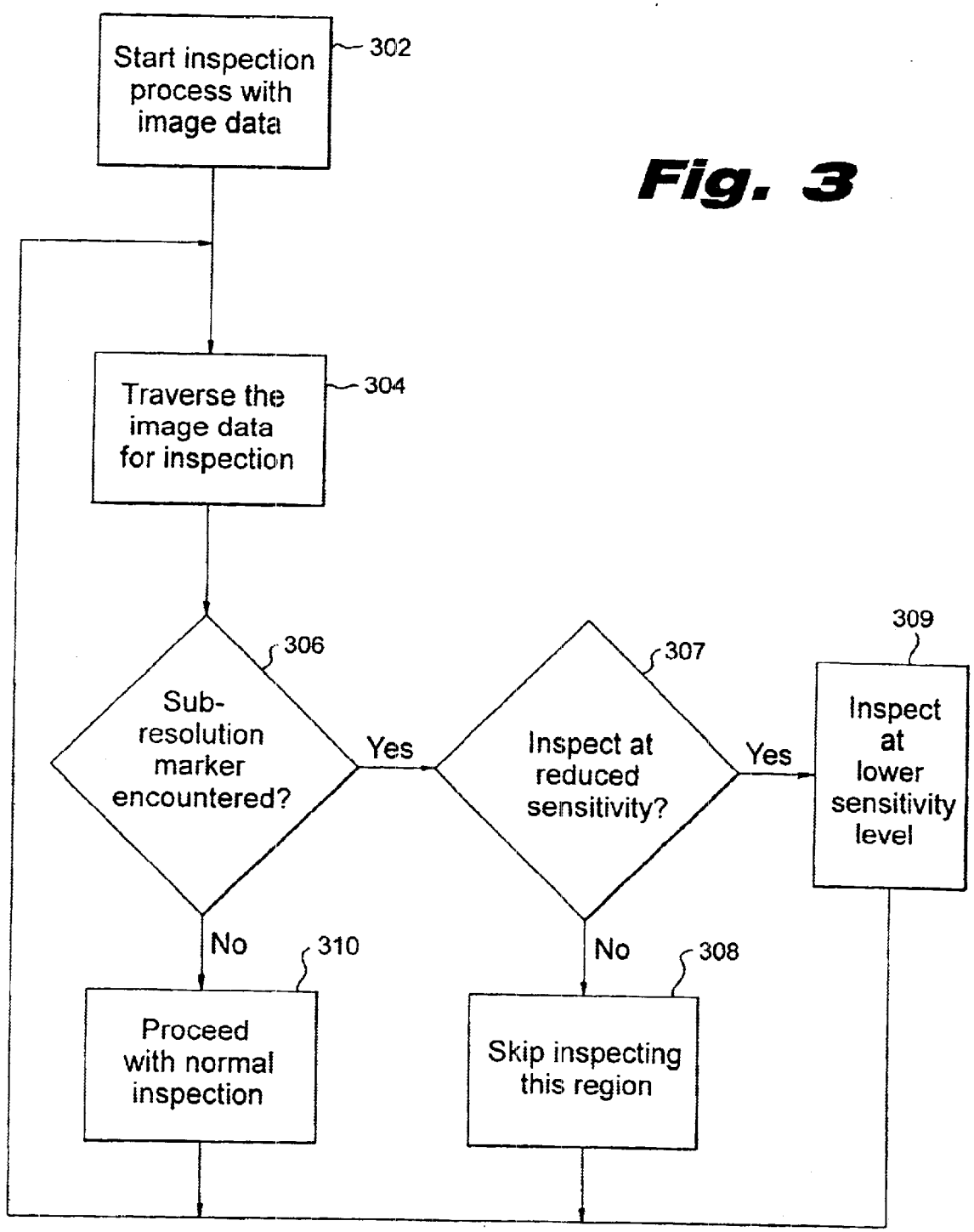
FIG. 3 illustrates a flow diagram for an inspection tool according to the present invention which detects designated fill areas and uses different criteria for inspection of these areas during the inspection process.

The present invention marks the fill images so that an operator or an automatic software system can easily recognize and avoid unnecessary inspection and repairs in the fill area. The fill images are made in an unusual shape typically not occurring on a plate. Such shapes may include serifs in the middle of the side of the contact hole, rather than the usual corner serifs. FIG. 1 illustrates an example of a fill image 100 which may be made on a mask. The fill image shown, typically a contact hole 102 includes serifs 104 in the middle of the side 108 of the contact hole 102. Other shapes may also be employed to distinguish the fill patterns. Additional examples of fill pattern images 402, 404, 406 are shown in FIGS. 4a, 4b, and 4c. Generally, any shape different in appearance from a primary pattern may be used in the present invention. The difference in appearance would allow for easy recognition for distinguishing between a primary pattern on a plate which must be inspected at a maximum sensitivity level and a fill pattern which may not need to undergo an inspection or only a low sensitivity level inspection. Skipping over or inspecting at lower sensitivity level would greatly increase the inspection throughput.

Yet another fill pattern of the present invention may be an alphanumeric designation as shown in FIG. 2. In FIG. 2, the fill pattern 200 includes one or more alphanumeric characters 202 formed on the fill area and spelling, for example, the word "fill". By reading the word, either manually or automatically, the fill region is identified which then need not be inspected and repaired. It should be understood that word formations other then "fill" can also be used for designation purposes.

The present invention also enables an automatic inspection tool, for example, computerized software tools, to recognize the fill pattern areas and either skip over the inspection and repair process for these regions or inspect these areas at a reduced sensitivity. For example, a design image which the software compares the mask image for inspection may be enhanced with a subresolution markers of, for example, value 0.01 micrometers to designate the fill pattern area. The subresolution markers may be any preselected value which would designate to software that the marker signifies a present of a fill pattern. The software in conjunction may be programmed to skip over the areas having the subresolution markers on the design images during the comparison process. Alternatively, the software may be programmed to inspect at reduced sensitivity when the software encounters these subresolution marker areas. By skipping these areas or inspecting at reduced sensitivity level greatly increases throughput during plate inspection.

FIG. 3 illustrates a flow diagram for an inspection tool according to the present invention which detects designated fill areas and skips over these areas during the inspection process. At step 302, inspection process begins by using a design image pattern data. In the present invention, the design image pattern would include subresolution markers placed in the design image to designate fill image regions. At step 304, the inspection tool start inspection of a mask by traversing the image data for the respective mask images. At step 306 if the inspection tool encounters the subresolution marker, the inspection tool determines at step 307 if this area should be inspected at a reduced sensitivity level, or if this area should not be inspected at all. At step 309, if it is determined that the area should be inspected at a reduced sensitivity lever, the inspection level is decreased to a lower level such that a larger granularity is inspected at one time. Otherwise, at step 308, inspection of the area designated as fill pattern region is omitted. Otherwise, at step 308, inspection of the area designated as fill pattern region is omitted. At step 310, the inspection tool recognizes main pattern area and performs normal inspection process. The inspection process continues until the whole plate has been inspected. Modulation of sensitivity levels in an inspection tool in the present invention employs any known technique for controlling inspection sensitivity levels and may include using courser or finer laser beams and/or modulating number of pixels to inspect at one pass.

Figure 5:
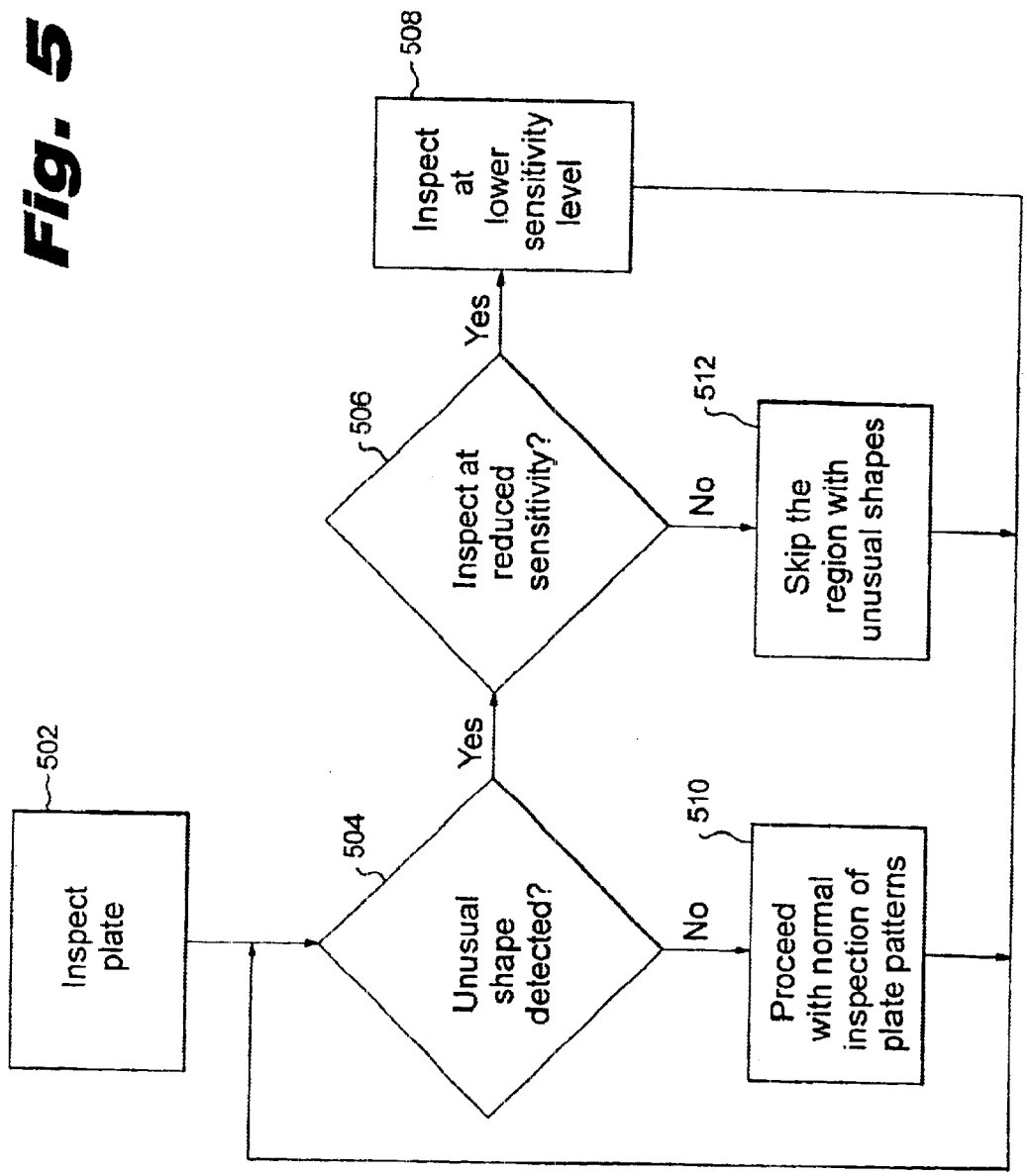
FIG. 5 illustrates a process of the present invention in which an operator manually or automatically inspects and recognizes the unusual shapes of the present invention used to designate fill pattern areas in order to skip or lower sensitivity levels during inspection for those areas.

FIG. 5 illustrates a process of the present invention in which an operator manually or automatically inspects and recognizes the unusual shapes of the present invention used to designate fill pattern areas in order to skip or lower sensitivity levels during inspection for those areas. At step 502 inspection process for semiconductor plates having primary and fill patterns begins. The process may be controlled by an automatic tool capable of recognizing fill patterns.

Alternatively, an operator may with an aid of microscopy tools inspect the patterns manually. At step 504, if an unusual shape such as those shown in FIG. 1, 2, 4a, 4b, or 4c, that is different in appearance from primary patterns is recognized, a determination is made at step 506 whether to skip inspection for this area or to reduce sensitivity level for inspecting this area. If it is determined to inspect at lower sensitivity, inspection of the area having unusual shape is inspected at larger granularity at step 508. That is, more area is inspected at one time. Otherwise, at step 512, inspection of this region is omitted. The inspection process then continues at 504 until the plate inspection is complete.

Inspecting at lower sensitivity as shown at step 508 or omitting inspection as at step 512 decreases inspection time for the overall plate, and thereby increases the throughput.

While the invention has been particularly shown and described with respect to a preferred embodiment thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for inspecting a semiconductor photolithographic mask having a patterned portion for selectively exposing light to a semiconductor wafer for forming a desired pattern thereon and having one or more non-critical fill pattern areas used to achieve a desired design pattern density, the method comprising:

implementing an inspection tool of a predetermined sensitivity level on a desired pattern;

identifying a selected shape formed in said mask that designates a fill pattern area; and in response to said identifying, one of:

reducing a sensitivity level of said inspection tool and inspecting the identified fill pattern area at the reduced sensitivity level, or omitting inspection of the identified fill pattern area, whereby non-critical fill pattern areas are easily recognized during said photomask inspection to thereby increase inspection throughput.

2. The method for inspecting a semiconductor mask as claimed in claim 1, wherein the selected shape is alphanumeric.

3. The method for inspecting a semiconductor mask as claimed in claim 1, wherein the selected shape includes one or more serifs located on one or more side edges of a fill pattern.

4. The method for inspecting a semiconductor mask as claimed in claim 1, wherein the selected shape includes atypical pattern different in appearance from a primary plate pattern.

5. The method for inspecting a semiconductor mask as claimed in claim 1, wherein the method is performed automatically by an automatic inspection tool.

6. The method for inspecting a semiconductor mask as claimed in claim 1, wherein the method is performed by an operator manually with an aid of one or more microscopy tools.

7. A method for automatically inspecting a semiconductor photolithographic mask having a patterned portion for selectively exposing light to a semiconductor wafer for forming a desired pattern thereon and having one or more non-critical fill pattern areas used to achieve a desired design pattern density, the method comprising:

providing data representing one or more subresolution markers in mask image pattern data input to an inspection tool that compares said image pattern data with said photolithographic mask, said subresolution markers demarcating one or more non-critical fill pattern regions;

automating an inspection tool to recognize one or more said subresolution markers in said data; and in response to recognizing said subresolution markers data, one of:

reducing a sensitivity level of said inspection tool when inspecting said mask and inspecting the identified fill pattern area at the reduced sensitivity level, or omitting inspection of the identified fill pattern area.

8. The method according to claim 7, wherein the subresolution markers comprise values less than or equal to 0.01 micrometers.

9. A program storage device readable by machine, tangibly embodying a program of instructions executable by the machine to perform method steps for automatically inspecting a semiconductor photolithographic mask having a patterned portion for selectively exposing light to a semiconductor wafer for forming a desired pattern thereon and having one or more non-critical fill pattern areas used to achieve a desired design pattern density, the method comprising:

providing data representing one or more subresolution markers in mask image pattern data input to an inspection tool that compares said image pattern data with said photolithographic mask, said subresolution markers demarcating one or more non-critical fill pattern regions;

automating an inspection tool to recognize one or more said subresolution markers in said data; and in response to recognizing said subresolution markers data, one of:

reducing a sensitivity level of said inspection tool when inspecting said mask and inspecting the identified fill pattern area at the reduced sensitivity level, or omitting inspection of the identified fill pattern area.

\* \* \* \* \*